United States Patent [19]
Schnur et al.

[11] Patent Number: 4,877,501
[45] Date of Patent: Oct. 31, 1989

[54] PROCESS FOR FABRICATION OF LIPID MICROSTRUCTURES

[76] Inventors: Joel M. Schnur, 6009 Lincolnwood Ct., Burke, Va. 22015; Ronald Price, Slip 39, Dock P, Mears Point Marina, Rt. 50 & Kent Narrows, Grasonville, Md. 21638; Paul Yager, 206, 10th St., S.E., Washington, D.C. 20003; Paul Schoen, 5006 Taney Ave., Alexandria, Va. 22304; Jacque H. Georger, 8409 Great Lake Rd., Springfield, Va. 22153; Alok Singh, 6340 Rockside St., Alexandria, Va. 22304

[21] Appl. No.: 11,838

[22] Filed: Feb. 6, 1987

[51] Int. Cl.[4] .......................... B01J 19/08; C07F 9/00; C11B 3/00
[52] U.S. Cl. .......................... 204/157.64; 204/157.73; 204/157.87; 260/398; 260/403; 260/405.6; 260/407; 260/426; 260/428.5
[58] Field of Search ...................... 204/157.15, 157.64, 204/157.63, 157.67, 157.68, 157.73, 157.87, 902; 260/398, 398.5, 403, 405.6, 407, 410.7, 426, 428.5

[56] References Cited
U.S. PATENT DOCUMENTS

| | | | |
|---|---|---|---|
| 4,489,133 | 12/1984 | Kornberg | 428/478.2 |
| 4,560,599 | 12/1985 | Regen | 260/403 |
| 4,634,599 | 1/1987 | Uzguis | 428/478.2 |

OTHER PUBLICATIONS

Yager et al., *Mol. Cryst. Liq. Cryst.*, 1984, vol. 106, 371–381.
Yager et al., *Biophysical Journal*, 1985, vol. 48, 899–906.
Nakashima et al., *J.A.C.S.*, 1985, vol. 107, 509–510.

*Primary Examiner*—John F. Niebling
*Assistant Examiner*—Ben C. Hsing
*Attorney, Agent, or Firm*—Wolf, Greenfield & Sacks

[57] ABSTRACT

Method and process for forming selected microstructures having predetermined shape and dimension from surfactants comprising the steps of: selecting a lipid which self aggregates into a predetermined microstructure selected from the group of helices and tubules; selecting a lipid solvating organic solvent; dissolving the selected lipid in the selected organic solvent; adding a predetermined amount of non-solvent to the selected organic solvent; and allowing the solution to sit for a predetermined period of time at a predetermined temperature.

19 Claims, No Drawings

PROCESS FOR FABRICATION OF LIPID MICROSTRUCTURES

U.S. GOVERNMENT RIGHTS IN THE INVENTION

This invention was made jointly by three employees of the Naval Research Laboratory, Washington, D.C. and three employees of Geo-Centers, Inc. The three Geo-Centers employees, at the time the invention was made, were in the performance of work under Naval Research Laboratory contract N00014-85-C-2243. The United States of America has certain rights in the invention arising out of that contract, including a nonexclusive, nontransferable, irrevocable, paid-up license to practice the invention or have it practiced for or on behalf of the United States throughout the world. The United States of America may also have rights in the invention derived form the three employees of the Naval Research Laboratory who are joint inventors of this invention.

BACKGROUND OF THE INVENTION

The present invention relates to the fabrication of lipid microstructures and in particular to the selective formation of tubular and helical microstructures of particular handedness from surfactants. Selected surfactants such as lipids are known to self-organize into a variety of structures with dimensions on the micron and submicron scale.

Under typical conditions however, lipids tend to form into a variety of geometrical forms with little control over dimension and shape. Heretofore synthetic control over the specific geometrical form and dimensions of such microstructures has been difficult except in cases involving lipid vesicles. The present invention achieves a method for the rational control of the dimensions of tubular and helical microstructures and the handedness of the helical microstructures. Such microstructures may be metalized and are particularly useful in the fabrication of small electrical circuits.

SUMMARY OF THE INVENTION

In accordance with the invention there is provided a process for forming selected microstructures having predetermined shape and dimension from surfactants comprising the steps of: selecting a lipid which self aggregates into a predetermined microstructure selected from the group of helices and tubules; selecting a lipid solvating organic solvent; adding a predetermined amount of water to the selected organic solvent; allowing the solution to sit for a predetermined period of time at a predetermined temperature.

The temperature of the formation solution is preferably maintained at between 10 and about 30 degrees Centigrade below the melting point as defined in excess water of the selected lipid; and, the solution is preferably allowed to sit in the shielded environment for less than about 24 hours.

Most preferably the organic solvent is selected from the group of alcohols, polyols, tetrahydrofuran, chloroform, and mixtures thereof and, enough non-solvent such as water (or in the case where chloroform comprises the selected organic solvent, a hydrocarbon solvent such as hexane, pentane, heptane, octane or the like) is added to the selected organic solvent lipid solution to achieve a volume ratio of organic solvent to non-solvent, preferably water, of greater than about 1:10. The concentration of the lipid dissolved in the pre-prepared organic solvent lipid solution is typically preselected to be less than about 2 mg/ml.

The backbone of the selected surfactant is typically derived from glycerol.

The lipid is most preferably selected to include one or two hydrocarbon chains, one or both of which include a diacetylenic moiety in conjugation within the chains.

The tubular and/or helical microstructures thus formed may be ruggedized by exposing the selected lipid solution for a predetermined period of time to high energy radiation which is capable of polymerizing the lipid.

The present invention most preferably utilizes surfactants having the following formula I:

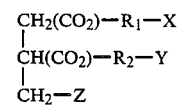

wherein $R_1$ and $R_2$ (attached to a glycerol based backbone) are typically a saturated or unsaturated hydrocarbon having from about 4 to 32 carbon atoms, X and Y are typically an alkyl or olefin having fewer than about 16 carbon atoms or an alpha, beta unsaturated carboxy moiety, and Z is a phosphoryl moiety such as phosphoryl ethanolamine, choline, serine, inositol, glycerol, 3'-O-aminoacyl glycerol, cardiolipin or other phosphoryl group found in naturally occurring phosphoglycerides.

Lipids which are especially capable of rapid formation of the selected helical and tubular microstructures are those having hydrocarbon chains such as $R_1$ and $R_2$ which contain diacetylenic moieties, preferably in conjugation. Most preferably phospholipids having the following formula II are used herein:

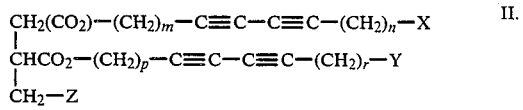

where m and p are 5, 6, 7, 8, 9, 10, or 11, and n and r are 0143 7, 8, 9, 10, 11, 12, 13, 14, 15 or 16 and where X, Y and Z are as mentioned above.

The ready and reproducible formation of tubular and helical microstructures having a diameter of between about 0.1 and about 3.0 microns, and selected lengths of less than about 1500 microns is achieved herein. The inventive process herein enables the formation of tubular and helical microstructures of a particular handedness formed from the above-referenced surfactants and further enables the formation of helices (of a selected handedness) and tubules having preselected lengths and diameters by selective variation of, inter alia, the composition of solvent in which the lipids are dispersed, the time of reaction, the temperature of the reaction mixture, the concentration of lipid in the solution, and the exposure and/or non-exposure of the reaction mixture to high energy ionizing (polymerizing) radiation during and after helix and/or tubule formation.

DETAILED DESCRIPTION OF PREFERRED EMBODIMENTS

A selected surfactant I is preferably first dispersed in a low molecular weight organic alcohol, polyol, tetrahydrofuran, chloroform, a mixture of two or more of all of the foregoing or other suitable water or non-solvent miscible organic solvent. Suitable organic alcohols and polyols are typically low molecular weight alcohols and polyols such as methanol, ethanol, propanol, isopropanol, butanol, isobutanol, propylene glycol, ethylene glycol and the like. The concentration of the lipid is typically selected to be less than about 1.5 mg of lipid per ml of organic solvent.

To the organic solvent lipid mixture is typically next added a predetermined volume of non-solvent selected to bring the volume ratio of organic solvent to non-solvent to greater than about 1:10, typically to between about 5:1 and about 1:5. Water is most preferred for use as the non-solvent, although other non-solvents such as hydrocarbons may be utilized in connection with certain selected lipid solvating organic solvents such as chloroform. Representative hydrocarbon non-solvents are pentane, hexane, heptane, octane and the like.

Tubule and helix formation may be effected in an apparently 100% selected organic solvent, including certain hydrocarbon solvents such as pentane, hexane, heptane and the like, however, the inventive method herein typically requires the presence of at least a trace amount of water.

Upon the addition of water to the organic solvent lipid mixture, the lipid aggregates into helical or tubular form. The temperature of the solution is typically maintained at about 10-30 degrees, and most preferably about 20 degrees Centigrade, below the melting point of the selected lipid I as defined in excess water. The helical and tubular aggregates will continue to grow in length from the lipid over time. According to the invention such tubular (hollow, open-ended cylinders) and helical (ribbon like—hollow left handed or right handed helices) lipid aggregates are typically allowed to grow to selected lengths, in part, by allowing the formation solution to sit in an environment shielded from radiation which may polymerize the selected lipid I for a predetermined period of time, typically less than about 24 hours and preferably less than about 12 hours.

The right-handedness or left handedness of helices which may be yielded from certain lipids may be predetermined by selecting a lipid having a particular chirality with respect to a certain carbon atom. For example where the preferred lipid I is selected, the handedness of helical microstructures which may be formed therefrom may be predetermined by preselecting either the L isomer (levorotatory) or D isomer (dextrorotatory) with respect to the central carbon atom of the glycerol based backbone thereof. Where the L isomer of lipid I is selected, helical microstructures yielded therefrom will be right-handed only. Where the D isomer is selected, the helical microstructures will be left-handed only; and where a racemic mixture of lipid I is used, both left-handed and right-handed helices will be yielded.

After the lipid mixture is allowed to sit for the preselected period of time, the tubules and helices thus formed may, if polymerizable, be ruggedized by polymerization of the lipid. Such polymerization is typically carried out by subjecting the mixture to high energy radiation, such as ultraviolet, X-ray, electron beam, gamma radiation or other radiation which may initiate polymerization and/or reaction within or between lipid molecules. Gamma radiation is most preferred to the extent it is less susceptible to scattering and absorption and thus typically effects homogenous irradiation. The relatively structurally unstable tubules and helices formed in the organic solvent, non-solvent formation solution are structurally locked into (hardened) their helical or tubular form upon irradiation and thus more readily retain their hardened structural form for subsequent use in the fabrication of propellants, resistive elements in small electronic circuits, separation membranes and the like.

Apart from controlling the extent of growth of the lipid helices and tubules (i.e. length) by varying the time in which the selected lipid is allowed to self aggregate in selected solution, the length of such tubules and helices may also be controlled by preselecting a relatively specific volume ratio of organic solvent to non-solvent, preferably water. According to the invention, the larger the ratio of volume of organic solvent to volume of non-solvent selected for use as the formation medium, the larger in length over a given period of time will the tubules and/or helices which form from the lipid be. Conversely, the smaller in ratio of volume of organic solvent to non-solvent selected, the shorter in length will the selected lipid helices and/or tubules be. The lipid is thus typically first dispersed in organic solvent and non-solvent subsequently added thereto; and the volume ratio of organic solvent to non-solvent, and the rate of addition of non-solvent to organic solvent or vice versa, is predetermined so as to predetermine a specific range of diameters and lengths (and the medians of such ranges) of the lipid helices and/or tubules which are formed in the solution. The concentration of the selected lipid which is first dispersed in the selected organic solvent is typically selected in the range of between about 0.3 mg/ml and about 2.0 mg/ml. Once the lipid has been solvated in the selected organic solvent, the preselected amount of non-solvent is added to the lipid organic solvent solution or vice versa. Water, hexane or the like acts as a poor or non-solvent with respect to the lipid which, as a result of poor solvating effect on the lipid, causes the lipid to self aggregate into a preselected tubular and/or helical form depending on the predetermination of, inter alia, the kind and amounts of organic solvent and non-solvent used as the formation solution medium.

The most preferred organic solvents for use herein are relatively polar organic solvents such as tetrahydrofuran, chloroform, and alcohols and polyols, such as methanol, ethanol, propanol, isopropanol, butanol, isobutanol, propylene glycol, ethylene glycol and mixtures of two or more of all of the foregoing.

The inventive process herein typically yields tubules and/or left-handed or right-handed helices having selected lengths of less than about 1500 microns. A reaction mixture having helices and/or tubules which fall within a pre-selected range of length, e.g., 2-10, 2-20, 2-40, 5-20, 5-30, 5-50, 10-50, 10-100, 10-150, 10-300, 20-200, 30-100 and any desired similar restricted ranges having preselected medians may be accomplished by varying one or more of: (a) the time the lipid solution is allowed to sit shielded from high energy radiation; (b) the ratio of volume of organic solvent to non-solvent for use as a solvent medium; (c) the specific organic solvent selected, (d) the temperature of the selected solvent medium; (e) the concentration of surfactant used in the organic solvent/non-solvent solution; and (f)

the handedness of the helical microstructures may be predetermined by preselecting the chirality of the lipid with respect to a selected carbon atom, i.e. preselecting a particular enantiomer.

Apart from a simple one-step addition of non-solvent to a pre-prepared selected organic solvent lipid solution in a reaction vessel, the non-solvent component of the formation solvent medium may be added gradually over time to the pre-prepared solution of the lipid in the selected organic solvent, such as by drop by drop addition, dialysis or other gradual addition of the non-solvent to the organic solvent solution over a relatively extended period of time. Such prolongation of the period of time over which the non-solvent component is added to the lipid solution, is another variable which may be employed to select, predetermine and vary the range in lengths (and medians thereof) of microstructures which may be fabricated hereby. Such gradual additions may be accomplished in a variety of conventional ways. For example a mixture of selected lipid and organic solvent may be placed in dialysis tube or bag, and the bag subsequently placed in a vessel containing water or to which vessel water is gradually added for the purposes of allowing the water to gradually invade the lipid/organic solvent mixture over time through the dialysis bag.

The pre-prepared organic solvent lipid solution may alternatively be added to the preselected amount of non-solvent in one step or gradually over a preselected period of time in essentially the same preselected manners that the non-solvent may be added to the pre-prepared organic solvent lipid solution.

Although the inventive process herein may yield microstructures in a selected formation solution whose lengths and diameters vary over pre-selected ranges, formation solutions having microstructure lengths which vary by as little as plus or minus about 5 microns in standard deviation around a preselected median microstructure length may be achieved. The typical range of standard deviations in length around a preselected median length which may be achieved herein by preselecting the kind and amounts of organic solvents, temperature, concentration of lipid in solution and time of allowing the lipid to self aggregate is from about 5 microns to about 100 microns in standard deviation. The typical range of standard deviations in diameter around a preselected median diameter which is achievable herein is between about 0.05 and about 0.3 microns. Typically the standard deviation in tubule or helix length around a preselected median length is less than about 60% of the value of the preselected median length; and the standard deviation in tubule or helix diameter around a preselected median diameter is typically less than about 25% of the value of the preselected median diameter. For example, if the preselected median length of tubules yielded in a preselected formation solution is about 170 microns, the solution will typically yield tubules having lengths which range in standard deviation around the 170 micron median by less than about 102 microns; similarly if the preselected median diameter of helices yielded in a preselected solvent medium is about 0.7 microns, the solution will typically yield helices having diameters which range in standard deviation around 0.7 microns by less than abut 0.42 microns.

Following are some exemplary formation routines according to the invention and the results thereof. In the following examples 1-12 the above referenced phospholipid II, where m and p were selected as 8 and n and r were selected as 9, X and Y were selected as methyl, and Z was selected as phosphoryl choline ($DC_{23}PC$, the L-isomer thereof, or 1, 2-bis (10, 12-tricosadiynoyl)-sn-glycero-3-phosphocholine) is selected for exemplary use:

EXAMPLE 1

0.5 mg of $DC_{23}PC$ and 1 ml of ethanol is placed in a glass vial. To the solution, 1.5 ml of distilled water is added and the vial is covered and allowed to sit in the dark for about 10 hours at room temperature. Upon addition of the water the solution turned cloudy in minutes. After 10 hours the solution may be observed under a Leitz Ortholux I optical microscope in both phase and dark field. Tubules 1-20 microns long and 0.1-0.7 microns in diameter are yielded.

EXAMPLE 2

0.5 mg of $DC_{23}PC$ and 1 ml of ethanol are placed in a glass vial. 1 ml of distilled water is added and the vial covered and allowed to sit in the dark for about 10 hours at room temperature. Viewing this solution in an optical microscope reveals tubules 1-40 microns long and 0.2-0.7 microns in diameter. Average tubule length is about 11.9 microns with a standard deviation of plus or minus 6 microns.

EXAMPLE 3

4.0 mg of $DC_{23}PC$ and 2.2 ml of ethanol are placed in a glass vial. 1.8 ml of distilled water is added and the vial covered and allowed to sit in the dark for about 10 hours at room temperature. This solution yields tubules with an average length of about 23 microns with a standard deviation of plus or minus 11 microns and with an average diameter of 0.47 microns and a standard deviation of plus or minus 0.1 microns.

EXAMPLE 4

0.5 mg of $DC_{23}PC$ and 1 ml of ethanol are placed in a glass vial. 0.43 ml of distilled water is added and the vial covered and allowed to sit in the dark for about 10 hours at room temperature. This solution yields tubules 10-350 microns long and 0.2-3.0 microns in diameter with right-handed helical structures being present having about the same dimensions as the tubules.

EXAMPLE 5

0.5 mg of $DC_{23}PC$ and 1 ml of ethanol are placed in a glass vial. 0.43 ml of distilled water are added and the vial covered and allowed to sit for about 10 hours at room temperature. Irradiating this solution at 4 degrees C in a $Co^{60}$ source at a dosage of 9.2 megarads results in red microstructures. This solution yields ruggedized tubules 10-300 microns in length. The solution yields tubules having diameters of 0.73 ±0.1 microns and also contains right-handed helical structures of about the same dimensions.

EXAMPLE 6

0.7 mg of $DC_{23}PC$ and 0.7 ml of ethanol are placed in a vial. 0.3 ml of distilled water is added and the vial covered and allowed to sit in the dark for about 144 hours. The solution yields tubules having an average length of about 50 microns with a standard deviation of plus or minus 31 microns, and right-handed helices are also yielded.

EXAMPLE 7 0.5 mg of $DC_{23}PC$ and 0.75 ml of ethanol are placed in a glass vial. 0.25 ml of distilled water is added and the vial covered and allowed to sit in the dark for about 360 hours at room temperature. This solution yields tubules 30–1200 microns in length with diameters varying from 0.5–3.0 microns. The tubules have an average length of about 170 microns plus or minus 92 microns and an average diameter of about 0.73 microns plus or minus 0.1 microns. The solution also contains right-handed helical structures of about the same dimensions. The diameter of a single tubule may also vary with one end being 0.5 microns and the other as large as 3 microns.

EXAMPLE 8

0.5 mg of $DC_{23}PC$ and 0.5 ml of isopropanol is placed in a glass vial. 0.5 ml of distilled water is added and the vial covered and allowed to sit in the dark for about 10 hours at room temperature. The solution yields tubules 10–170 microns in length, 0.2–1.0 microns in diameter and also yields right-handed helical structures.

EXAMPLE 9

The microstructures may also be fabricated by slowly adding water over time to an organic solvent lipid solution. For example, in a dialysis tube, 0.5 mg of $DC_{23}PC$ is added to 1.5 ml of ethanol. The bag is then placed in a beaker of 4 liter total capacity containing 500 ml of 95% ethanol. Water is added to the beaker drop by drop at a rate of 88 ml/hour until there is a total volume in the beaker of 2 liter. All of the solutions are maintained at room temperature. The bag is then removed from the beaker and placed in a beaker with 1 liter of distilled water and dialyzed at room temperature for 3 hours. The tubules are then removed from the bag and placed in a glass vial and lowered in temperature to 4 degrees C and polymerized by gamma radiation in a $Co^{60}$ source The tubules yielded from this preparation range in lengths from 10–350 microns and an average diameter of 0.7 microns and right-handed helical structures are also yielded. No change in the structures occurs during polymerization.

EXAMPLE 10

1.0 mg of $DC_{23}PC$ and 0.4 ml of chloroform with a trace amount of water is added to a glass vial; 3.6 ml of hexane is then added to the vial; the vial is covered and stored in the dark for about 10 hours at room temperature. This solution yields tubules from less than a micron in length up to 10 microns in length.

EXAMPLE 11

0.3 mg of $DC_{23}PC$ and 0.9 ml of propylene glycol are added to a glass vial, and 0.1 ml of distilled water is next added to the vial. The vial is covered and allowed to sit in the dark for about 10 hours at room temperature. This solution yields short tubules no longer than about 10 microns in length.

EXAMPLE 12 30.04 mg of $DC_{23}PC$ and 29.95 ml of ethanol are placed in a glass vial. 12.96 ml of distilled water is next added and allowed to sit at room temperature for about 264 hours. This solution yields tubules 10–350 microns long and 0.2–3.0 microns in diameter; right-handed helical structures are also yielded.

EXAMPLE 13

1.17 mg of 1,2-bis (10, 12-tricosa diynoyl, 22-ene)-sn-glycero-3-phosphocholine and 1.17 ml of ethanol are placed in a glass vial. The solution is then cooled to 5.0° C. ±0.7° C. and 1.17 ml of distilled water at 5.0° C. is added to the vial. The vial is kept at 5.0° C. for two weeks and the solution is dialyzed to distilled water. The solution yields tubules 2–40 microns in length and right-handed helical microstructures are also yielded.

EXAMPLE 14

2.42 mg of 2, 3-bis (10,12-tricosa diynoyl)-sn-glycero-1-phosphocholine, the D isomer of $DC_{23}PC$, and 2.42 ml of isopropanol is placed in a glass vial. To this solution 2.42 ml of distilled water is added and allowed to sit for 10 hours. The solution yields tubules 5–200 microns in length and left-handed helical microstructures are also yielded.

It will now be apparent to those skilled in the art that other embodiments, improvements, details, and uses can be made consistent with the letter and spirit of the foregoing disclosure and within the scope of this patent, which is limited only by the following claims, construed in accordance with the patent law, including the doctrine of equivalents.

What is claimed is:

1. Process for forming microstructures of selected shape and dimension from surfactants comprising the steps of:
    selecting a lipid which self aggregates into a microstructure selected from the group consisting of helices and tubules;
    selecting a lipid solvating organic solvent in which microstructures form;
    dissolving the selected lipid in the selected organic solvent;
    adding a non-solvent to the selected organic solvent in an amount sufficient to initiate microstructure growth;
    allowing the selected lipid to grow into the microstructure in the solution of organic solvent and non-solvent for a period of time and at a temperature below the melting point of the selected lipid.

2. The process of claim 1 wherein the step of allowing further comprises maintaining the temperature of the solution at between 10 and about 30 degrees Centigrade below the melting point of the lipid in water.

3. The process of claim 2 wherein said period of time is less than about 24 hours.

4. The process of claim 2 wherein the organic solvent is selected from the group consisting of alcohols, polyols, tetrahydrofuran, chloroform, and mixtures thereof.

5. The process of claim 2 wherein the step of adding further comprises adding enough non-solvent to the selected organic solvent to achieve a volume ratio of organic solvent to non-solvent of greater than about 1:10.

6. The process of claim 1 wherein said period of time is less than about 24 hours.

7. The process of claim 1 wherein the organic solvent is selected from the group consisting of alcohols, polyols, tetrahydrofuran, chloroform, and mixtures thereof.

8. The process of claim 7 wherein the step of adding further comprises adding enough non-solvent to the selected organic solvent to achieve a volume ratio of organic solvent to water of greater than about 1:10.

9. The process of claim 8 wherein the step of selecting the lipid further comprises preselecting a certain amount of the lipid to be dissolved in the selected organic solvent.

10. The process of claim 9 further comprising exposing the lipid solution for a period of time to radiation which will polymerize the lipid.

11. The process of claim 9 wherein the selected lipid has the formula:

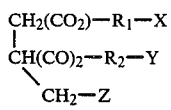

wherein $R_1$ and $R_2$ are selected from the group consisting of saturated and unsaturated hydrocarbon chains having fewer than thirty two carbon atoms, X and Y are selected from the group consisting of alkyl, olefin, and alpha, beta unsaturated carboxy compounds, and Z is a phosphoryl moiety.

12. The process of claim 11 wherein one of both of $R_1$ and $R_2$ include a diacetylenic moiety in conjugation.

13. The process of claim 12 wherein the non-solvent is selected from the group consisting of water and hydrocarbon non-solvents.

14. The process of claim 1 wherein the step of selecting the lipid further comprises preselecting a certain amount of the lipid to be dissolved in the selected organic solvent.

15. The process of claim 1 further comprising exposing the lipid solution for a period of time to radiation which will polymerize the lipid.

16. The process of claim 1 wherein the selected lipid has the formula:

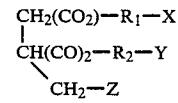

wherein $R_1$ and $R_2$ are selected from the group consisting of saturated and unsaturated hydrocarbon chains having fewer than thirty two carbon atoms, X and Y are selected from the group consisting of alkyl, olefin, and alpha, beta unsaturated carboxy compounds, and Z is a phosphoryl moiety.

17. The process of claim 16 wherein one or both of $R_1$ and $R_2$ include a diacetylenic moiety in conjugation.

18. The process of claim 17 wherein the non-solvent is selected from the group consisting of water and hydrocarbon non-solvents.

19. The process of claim 16 wherein the lipid as the formula:

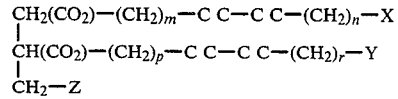

where m and p are selected from the group consisting of 5, 6, 7, 8, 9, 10, and 11 and n and r are selected from the group consisting of 7, 8, 9, 10, 11, 12, 13, 14, 15 and 16.

* * * * *